(12) United States Patent
Baek et al.

(10) Patent No.: US 9,959,835 B2
(45) Date of Patent: May 1, 2018

(54) CLOCK AND DATA RECOVERY CIRCUIT DETECTING UNLOCK OF OUTPUT OF PHASE LOCKED LOOP

(71) Applicant: SAMSUNG ELECTRONICS CO., LTD., Suwon-si, Gyeonggi-Do (KR)

(72) Inventors: Dong-Hoon Baek, Seoul (KR); Hyunwook Lim, Seoul (KR); Kwi Sung Yoo, Yongin-si (KR); Eun-Young Jin, Hwaseong-si (KR); Kyongho Kim, Hwaseong-si (KR); JaeYoul Lee, Hwaseong-si (KR); Youngmin Choi, Yongin-si (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 30 days.

(21) Appl. No.: 15/271,837

(22) Filed: Sep. 21, 2016

(65) Prior Publication Data
US 2017/0116954 A1 Apr. 27, 2017

(30) Foreign Application Priority Data
Oct. 22, 2015 (KR) .................. 10-2015-0147591

(51) Int. Cl.
*G09G 5/00* (2006.01)
*H03L 7/08* (2006.01)
(Continued)

(52) U.S. Cl.
CPC ........... *G09G 5/008* (2013.01); *G09G 3/2096* (2013.01); *H03L 7/0807* (2013.01);
(Continued)

(58) Field of Classification Search
CPC ...... G09G 3/2096; G09G 5/006; G09G 5/008; G09G 2310/027; G09G 2310/0272; H03L 7/08–7/0898
See application file for complete search history.

(56) References Cited

U.S. PATENT DOCUMENTS 5,712,863 A * 1/1998 Gray .................. G11B 20/10
370/506
5,815,514 A * 9/1998 Gray .................. G11B 20/10
341/58
(Continued)

FOREIGN PATENT DOCUMENTS

JP   2006-261725   9/2006
JP   2013-183271   9/2013
(Continued)

*Primary Examiner* — Gene W Lee
(74) *Attorney, Agent, or Firm* — F. Chau & Associates, LLC

(57) ABSTRACT

A clock and data recovery circuit in accordance with an embodiment of the inventive concept includes a phase locked loop configured to receive a data stream into which an additional bit is inserted at every reference period to generate parallelized data and a clock signal, and a first detector circuit configured to determine whether the parallelized data is locked based on a bit-conversion of the data stream according to an insertion of the additional bit. The bit-conversion is executed with respect to the additional bits according to a predetermined protocol, or is executed with respect to at least one bit from among data of the data stream between a current one of the additional bits and a next one of the additional bits.

20 Claims, 11 Drawing Sheets

(51) Int. Cl.
*H03L 7/089* (2006.01)
*G09G 3/20* (2006.01)

(52) U.S. Cl.
CPC ..... *H03L 7/0891* (2013.01); *G09G 2310/027* (2013.01); *G09G 2330/10* (2013.01); *G09G 2370/10* (2013.01); *G09G 2370/16* (2013.01)

(56) References Cited

U.S. PATENT DOCUMENTS

| | | | | |
|---|---|---|---|---|
| 5,931,968 A * | 8/1999 | Gray | ............. | G11B 20/10 714/739 |
| 6,167,550 A * | 12/2000 | Gray | ............. | G11B 20/10 714/701 |
| 6,260,171 B1 * | 7/2001 | Gray | ............. | G11B 20/10 714/771 |
| 6,345,079 B1 * | 2/2002 | Ohishi | ............. | H03L 7/095 375/327 |
| 6,363,512 B2 * | 3/2002 | Gray | ............. | G11B 20/10 369/275.3 |
| 6,513,139 B2 * | 1/2003 | Gray | ............. | G11B 20/10 714/701 |
| 6,543,024 B2 * | 4/2003 | Gray | ............. | G11B 20/10 714/701 |
| 6,643,347 B2 * | 11/2003 | Ohishi | ............. | H03L 7/095 327/156 |
| 7,020,791 B1 * | 3/2006 | Aweya | ............. | G06F 1/12 327/141 |
| 7,130,368 B1 * | 10/2006 | Aweya | ............. | H03L 7/085 375/326 |
| 7,577,226 B2 * | 8/2009 | Sou | ............. | H04L 7/0337 370/395.62 |
| 7,643,598 B2 | 1/2010 | Byun et al. | | |
| 7,898,518 B2 * | 3/2011 | Hong | ............. | G09G 3/3611 345/100 |
| 7,936,330 B2 * | 5/2011 | Park | ............. | G09G 3/3611 345/100 |
| 7,948,465 B2 * | 5/2011 | Cho | ............. | G09G 3/006 345/100 |
| 8,074,125 B2 | 12/2011 | Lee | | |
| 8,212,803 B2 * | 7/2012 | Hong | ............. | G09G 3/3648 345/213 |
| 8,259,944 B2 * | 9/2012 | Suvakovic | ............. | H04L 9/065 380/268 |
| 8,330,699 B2 * | 12/2012 | Hong | ............. | G09G 3/3648 345/100 |
| 8,362,997 B2 | 1/2013 | Huang et al. | | |
| 8,588,357 B2 | 11/2013 | Kuo et al. | | |
| 8,878,792 B2 | 11/2014 | Lim et al. | | |
| 8,878,828 B2 | 11/2014 | Baek et al. | | |
| 9,147,376 B2 * | 9/2015 | Lee | ............. | G09G 3/3688 |
| 2002/0080900 A1 * | 6/2002 | Ohishi | ............. | H03L 7/095 375/373 |
| 2009/0313697 A1 * | 12/2009 | Suvakovic | ............. | H04L 9/065 726/22 |
| 2010/0156885 A1 * | 6/2010 | Cho | ............. | G09G 3/006 345/214 |
| 2013/0076412 A1 | 3/2013 | Shirai | | |
| 2015/0146833 A1 | 5/2015 | Byun | | |

FOREIGN PATENT DOCUMENTS

KR    1020120135805    12/2012
KR    10-1252191    4/2013

* cited by examiner

CLOCK AND DATA RECOVERY CIRCUIT DETECTING UNLOCK OF OUTPUT OF PHASE LOCKED LOOP

CROSS-REFERENCE TO RELATED APPLICATIONS

This U.S. non-provisional patent application claims priority under 35 U.S.C. § 119 to Korean Patent Application No. 10-2015-0147591, filed on Oct. 22, 2015, the disclosure of which is incorporated by reference herein.

BACKGROUND

1. Technical Field

The inventive concept relates to display devices, and more particularly, to a clock and data recovery circuit included in a source driver of a display device.

2. Discussion of Related Art

A display device uses a display driver integrated circuit (DDI) to drive a display panel. A source driver including a DDI receives data from a timing controller and performs a series of treatment processes to display the received data on a display panel.

While a delay locked loop (DLL) can be used to detect an error in the received data, a reference clock signal is lost during the detection. When a phase locked loop is used to detect the error, even if an error occurs in the received data, an output of the PLL is not lost during the detection.

However, an error detection method used in a clock and data recovery circuit using a DLL cannot be directly applied to a clock and data recovery circuit using a PLL.

SUMMARY

According to an exemplary embodiment of the inventive concept, a clock and data recovery circuit includes a phase locked loop configured to receive a data stream into which an additional bit is inserted at every reference period to generate parallelized data and a clock signal, and a first detector circuit configured to determine whether the parallelized data is locked based on a bit-conversion of the data stream according to an insertion of the additional bits. The bit-conversion is executed with respect to the additional bits according to a predetermined protocol, or is executed with respect to at least one bit from among data of the data stream located between a current one of the additional bits and a next one of the additional bits.

In an embodiment of the inventive concept, as a result of the bit-conversion, one of the additional bits and data just ahead of the additional bit have different logic values from each other.

In an embodiment of the inventive concept, the first detector circuit includes a first counter configured to count a number of times the bit-conversion fails.

In an embodiment of the inventive concept, the first detector circuit determines that the parallelized data is unlocked when the counted number of times exceeds a reference number and transmits a value to an outside source indicating whether the parallelized data is unlocked.

In an embodiment of the inventive concept, the phase locked loop includes a sampling circuit configured to synchronize the data stream with the clock signal, and to parallelize the synchronized data stream to generate the parallelized data, a phase detector configured to detect a phase difference between the synchronized data stream and the clock signal to output an up signal and a down signal, a charge pump configured to receive the up signal and the down signal to output a control current, a loop filter configured to receive the control current to output a control voltage, and a voltage controlled oscillator configured to receive the control voltage to generate the clock signal.

In an embodiment of the inventive concept, the clock and data recovery circuit further includes a second detector circuit configured to receive the control voltage and to determine whether the parallelized data is locked on the basis of a first reference voltage greater than a level of the control voltage and a second reference voltage smaller than the level of the control voltage.

In an embodiment of the inventive concept, the second detector circuit includes a first amplifier configured to receive the first reference voltage and the control voltage to output a first voltage, a second amplifier configured to receive the second reference voltage and the control voltage to output a second voltage, and a logic circuit configured to determine whether a level of the control voltage is between a level of the first reference voltage and a level of the second reference voltage on the basis of the first voltage and the second voltage.

In an embodiment of the inventive concept, the logic circuit includes a second counter configured to count a number of times the bit-conversion fails on the basis of an output of the logic circuit.

In an embodiment of the inventive concept, the second detector circuit determines that the parallelized data is unlocked when the counted number of times exceeds a reference value and transmits a value indicating whether the parallelized data is unlocked to an outside source.

According to an exemplary embodiment of the inventive concept, a clock and data recovery circuit includes a phase locked loop configured to receive a data stream into which an additional bit is inserted at every reference period to generate parallelized data and a clock signal, a first detector circuit configured to determine whether the parallelized data is locked based on a bit-conversion of the data stream according to an insertion of the additional bits, and a second detector circuit configured to determine whether the parallelized data is locked based on a control voltage output from the phase locked loop. The bit-conversion is executed with respect to the additional bits according to a predetermined protocol, or is executed with respect to at least one bit from among data of the data stream between a current one of the additional bits and a next one of the additional bits.

In an embodiment of the inventive concept, the clock and data recovery circuit further includes an OR gate configured to perform an OR operation on an output of the first detector circuit and an output of the second detector circuit.

In an embodiment of the inventive concept, the phase locked loop includes a sampling circuit configured to synchronize the data stream with the clock signal and to parallelize the synchronized data stream to generate the parallelized data, a phase detector configured to detect a phase difference between the synchronized data stream and the clock signal to output an up signal and a down signal, a charge pump configured to receive the up signal and the down signal to output a control current, a loop filter configured to receive the control current to output a control voltage, and a voltage controlled oscillator configured to receive the control voltage to generate the clock signal.

In an embodiment of the inventive concept, the first detector includes a first counter configured to count a number of times the bit-conversion fails. In an embodiment, the first detector determines that the parallelized data is unlocked when the counted number of times exceeds a reference number and transmits a value indicating whether the parallelized data is unlocked to an outside source.

In an embodiment of the inventive concept, the second detector circuit includes a first amplifier configured to receive the first reference voltage and the control voltage to output a first voltage, a second amplifier configured to receive the second reference voltage and the control voltage to output a second voltage, and a logic circuit configured to determine whether a level of the control voltage is between a level of the first reference voltage and a level of the second reference voltage on the basis of the first voltage and the second voltage.

In an embodiment of the inventive concept, the logic circuit includes a second counter configured to count a number of times the bit-conversion fails on the basis of an output of the logic circuit. In an embodiment, the second detector circuit determines that the parallelized data is unlocked when the counted number of times exceeds a reference number and transmits a value indicating whether the parallelized data is unlocked to an outside source.

According to an exemplary embodiment of the inventive concept, a display apparatus driving circuit includes a timing controller configured to insert an additional bit periodically into received image data to generate modified image data, generate a data stream including the modified image data, and output the data stream, and a source driver configured to receive the data stream. The source driver includes a phase locked loop configured to generate parallelized data and a clock signal from the received data stream and a detector circuit configured to determine whether the parallelized data is locked based on values of the additional bits in the received data stream.

In an embodiment, the timing controller inserts the additional bit with a value different from an adjacent bit.

In an embodiment, the detector circuit outputs a value to the timing controller indicating whether the parallelized data is locked. In an embodiment, the timing controller retransmits the data stream to the source driver when the value indicates the parallelized data is not locked.

BRIEF DESCRIPTION OF THE FIGURES

Exemplary embodiments of the inventive concept will be more clearly understood from the following detailed description take in conjunction with the accompanying drawings, in which.

DETAILED DESCRIPTION

Figure 1:
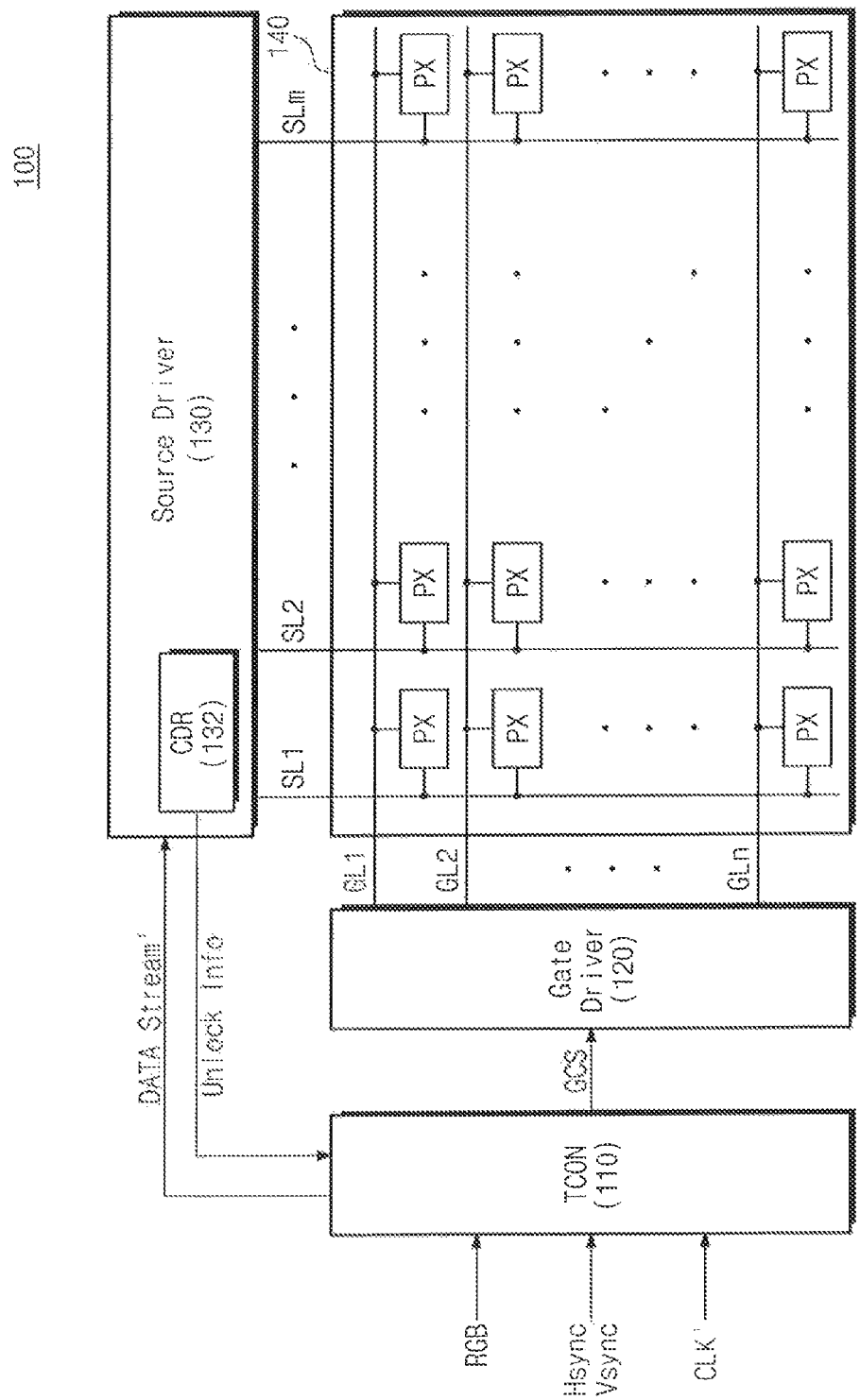
FIG. 1 is a block diagram illustrating a display device including a clock and data recovery circuit according to an exemplary embodiment of the inventive concept.

Exemplary embodiments of inventive concept will now be described more fully hereinafter with reference to the accompanying drawings, in which exemplary embodiments are shown. The inventive concept may, however, be embodied in many different forms and should not be construed as limited to the exemplary embodiments set forth herein. Rather, these exemplary embodiments are provided so that this disclosure will be thorough and complete, and will fully convey the scope of the inventive concept to those skilled in the art. In the drawings, the size and relative sizes of layers and regions may be exaggerated for clarity. Like numbers refer to like elements throughout.

It will be understood that when an element is referred to as being "connected" or "coupled" to another element, it can be directly connected or coupled to the other element or intervening elements may be present. As used herein, the singular forms "a", "an" and "the" are intended to include the plural forms as well, unless the context clearly indicates otherwise.

FIG. 1 is a block diagram illustrating a display device including a clock and data recovery circuit according to an exemplary embodiment of the inventive concept. Referring to FIG. 1, a display device 100 includes a timing controller 110, a gate driver 120, a source driver 130 and a display panel 140.

The timing controller 110 may receive image information RGB and a control signal from an external source. The image information may include red, green, and blue image data. For example, the control signal may include a vertical synchronous signal Vsync, a horizontal synchronous signal Hsync, and an external clock signal CLK'. The timing controller 110 may generate a serialized data stream (DATA Stream') by changing a format of the image information RGB to accord with a specification of the source driver 130 and transmit the generated data stream (DATA Stream) to the source driver 130.

The timing controller 110 may generate a gate control signal GCS on the basis of the control signals (e.g., RGB, Vsync, Hsync, CLK') and transmit the generated gate control signal GCS to the gate driver 120. The gate control signal GCS may include a signal which directs the beginning of scanning a signal controlling an output period of a gate-on voltage or a gate-off voltage, and a signal controlling a duration time of a gate-on voltage or a gate-off voltage. For example, the gate control signal GCS may indicate when a gate-on voltage is to start and end and when a gate-off voltage is to start and end.

The gate driver 120, in response to the gate control signal GCS, may drive the gate lines GL1 through GLn so that the data stream (DATA stream') is sequentially output to the display panel 140.

The source driver 130 includes a clock and data recovery circuit 132 which checks the data stream (DATA stream')

received from the timing controller 110 for an error and recovers the checked error. The clock and data recovery circuit 132 may detect whether data output from a phase locked loop included in the clock and data recovery circuit 132 is unlocked. The clock and data recovery circuit 132 may transmit unlock information based on a detection result to the timing controller 110. In an embodiment, the timing controller 110 retransmits the data stream (DATA stream') to the source driver 130 in response to receipt of the unlock information. The source driver 130 may output a gray scale voltage corresponding to the received data stream (DATA stream') to the display panel 140 through the source lines SL1, SL2, . . . , SLm. A structure and an operation method of the clock and data recovery circuit 132, according to exemplary embodiments of the inventive concept, will be described in further detail below.

The display panel 140 includes pixels PX arranged in positions at which the gate lines GL1 through GLn and the source lines SL1 through SLm intersect. The display panel 140 may be various types of display panels such as an organic light-emitting diode (OLED), a liquid crystal display (LCD) panel, an electrophoretic display panel, an electrowetting display panel, plasma display panel (PDP), etc.

Figure 2:
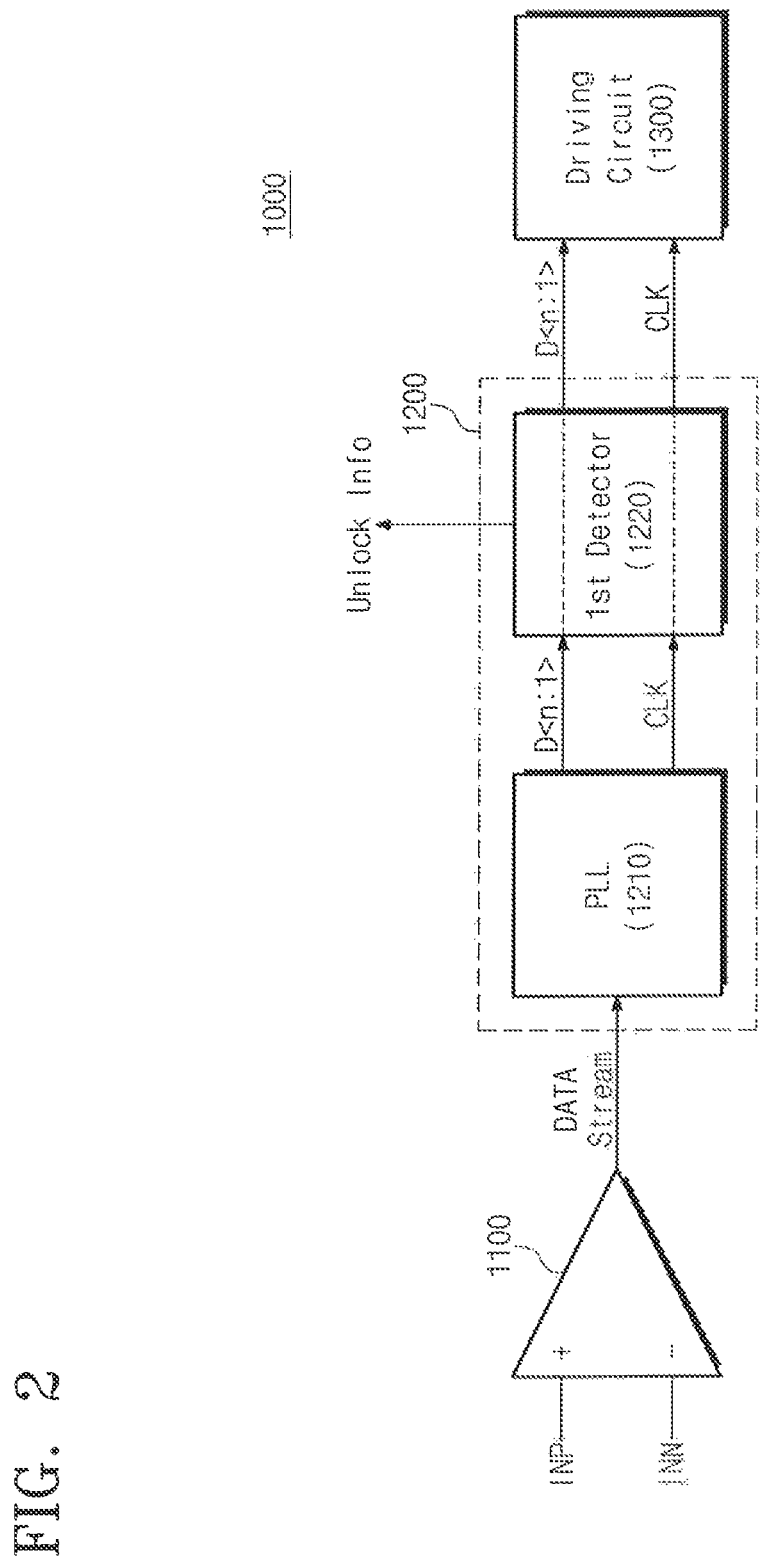
FIG. 2 is a block diagram illustrating a source driver of FIG. 1 according to an exemplary embodiment of the inventive concept.

FIG. 2 is a block diagram illustrating a source driver 130 of FIG. 1 according to an exemplary embodiment of the inventive concept. Referring to FIG. 2, a source driver 1000 includes an amplifier 1100, a clock and data recovery circuit 1200, and a driving circuit 1300.

A small signal type of data stream (DATA stream') received from the timing controller 110 (refer to FIG. 1) may be converted into input signals INP and INN through an analog front end (not illustrated). The analog front end may include analog signal conditioning circuitry that uses sensitive analog amplifiers. The amplifier 1100 may amplify the converted input signals INP and INN to output a serialized data stream (DATA stream).

The clock and data recovery circuit 1200 includes a phase locked loop (PLL) 1210 and a first detector 1220 (e.g., a detector circuit). The phase locked loop (PLL) 1210 may generate a locked clock signal CLK based on the data stream (DATA stream). The phase locked loop (PLL) 1210 may synchronize the data stream (DATA stream) with the clock signal CLK. The phase locked loop (PLL) 1210 may parallelize the data stream (DATA stream) synchronized with the clock signal CLK to output n-bit data (D<n:1>). The first detector 1220 may receive the data (D<n:1>) output from the phase locked loop (PLL) 1210 to determine whether an error exists in the received data (D<n:1>).

More specifically, the first detector 1220 monitors an additional bit inserted into the data stream (DATA stream) in real time. The additional bit may refer to a dummy bit which is added at regular periods to determine whether the data (D<n:1>) is locked. The additional bit may have a logic value different from the data just ahead of the additional bit. For example, if the data just ahead of the additional bit has a logic value of '0', the additional bit has a logic value of '1'. In contrast, if the data just ahead of the additional bit has a logic value of '1', the additional bit has a logic value of '0'. However, the additional bit does not necessarily need to have a bit-converted value and data right behind the additional bit may have a bit-converted value according to a determined protocol.

The first detector 1220 may monitor whether the additional bit has a proper bit-converted value in real time. If it is detected that the additional bit does not have a proper bit-converted value, the first detector 1220 generates unlock information. The unlock information may be transmitted to the timing controller 110 to cause retransmission of the data stream (DATA stream). In an embodiment, the additional bit has a proper bit converted value when its value differs from a value of an immediate adjacent bit. In an embodiment, the additional bit has a proper bit converted value when values of adjacent bits immediately before and after the additional bit are the same as one another, but different from a value of the additional bit. In an embodiment, a bit-conversion fail has occurred when the additional bit is determined not to have the proper bit converted value. A detailed operation of the first detector 1220 will be described in detail below.

In an embodiment, the driving circuit 1300 generates a gray scale voltage to be output to pixels PX of the display panel 140 (refer to FIG. 1) using the data (D<n:1>) and the clock signal CLK. The generated gray scale voltage is output to the display panel 140 through the source lines SL1 through SLm.

Figure 3:
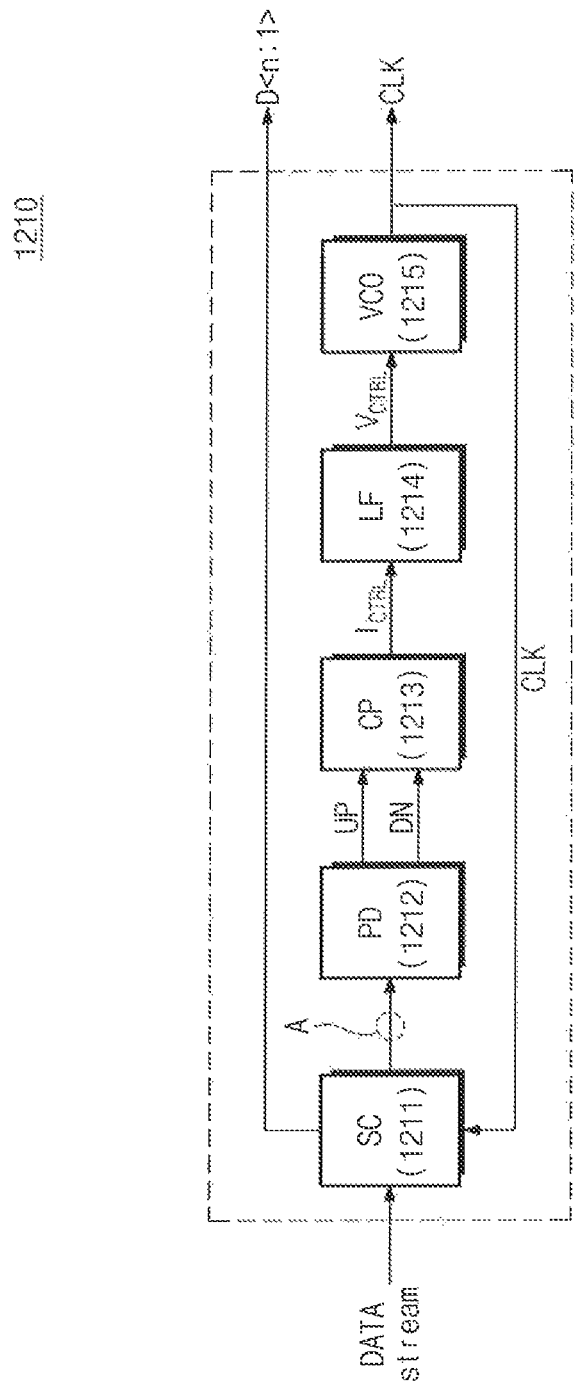
FIG. 3 is a block diagram illustrating a phase locked loop of FIG. 2 according to an exemplary embodiment of the inventive concept.

FIG. 3 is a block diagram illustrating a phase locked loop of FIG. 2 according to an exemplary embodiment of the inventive concept. Referring to FIG. 3, the phase locked loop (PLL) 1210 includes a sampling circuit (SC) 1211, a phase detector (PD) 1212, a charge pump (CP) 1213, a loop filter (LP) 1214 and a voltage controlled oscillator (VCO) 1215. In an exemplary embodiment, the phase locked loop (PLL) 1210 further includes a divider (not illustrated) that receives a clock signal CK generated from the voltage controlled oscillator (VCO) 1215 to divide the received clock signal CK at a division rate to generate a divided clock signal and to transmit the divided clock signal to the sampling circuit (SC) 1211. In an embodiment, the phase locked loop (PLL) 1210 has a negative feedback structure so that a phase of the clock signal CK does not fluctuate (i.e., a phase of the clock signal CK is locked).

The sampling circuit (SC) 1211 receives a data stream (DATA stream) and a clock signal CLK. The sampling circuit (SC) 1211 may generate a clock signal CLK based on the data stream (DATA stream). The sampling circuit (SC) 1211 may parallelize the data stream (DATA stream) synchronized with the clock signal CLK to output n-bit data (D<n:1>). According to the operation described above, the data stream (DATA stream) and the clock signal CLK being output from the phase locked loop (PLL) 1210 may all be stabilized (i.e., be locked).

The PD (phase detector) 1212 receives the clock signal CLK and the data stream (DATA stream) synchronized with the clock signal CLK. The clock signal CLK and the data stream (DATA stream) synchronized with the clock signal CLK are represented by A. The phase detector (PD) 1212 compares frequencies of the clock signal CLK and the data stream (DATA stream) synchronized with the clock signal CLK. For example, in a case where a phase of the data stream (DATA stream) synchronized with the clock signal CLK is ahead of a phase of the clock signal CLK, the phase detector (PD) 1212 may output an UP signal of a logic high and a down DN signal of a logic low. In contrast, in a case where a phase of the data stream (DATA stream) synchronized with the clock signal CLK falls behind a phase of the clock signal CLK, the PD (phase detector) 1212 may output an UP signal of a logic low and a down DN signal of a logic high.

The charge pump (CP) 1213 receives the up signal UP and the down signal DN to generate a control current $I_{CTRL}$. The charge pump (CP) 1213 may include at least one current source, at least two switches controlled by the up signal and the down signal, and at least one capacitor. However, the inventive concept is not limited thereto. The charge pump (CP) 1213 may be embodied by a circuit capable of converting a signal input to the charge pump (CP) 1213 into a current.

The loop filter (LF) 1214 may operate as a differentiator or an integrator that converts the control current $I_{CTRL}$ which is output from the charge pump (CP) 1213 into a control voltage $V_{CTRL}$. Also, the loop filter (LF) 1214 may remove a high frequency of the signal $I_{CTRL}$ which is output from the charge pump (CP) 1213. That is, the loop filter (LF) 1214 may operate as a low pass filter (LPF). For example, the loop filter (LP) 1214 may include at least one capacitor and at least one resistor. However, the loop filter (LP) 1214 is not limited to the embodiments described above and may be embodied by a variety of other elements that operate as a differentiator, an integrator, or a low pass filter (LPF).

The voltage controlled oscillator (VCO) 1215 receives a control voltage $V_{CTRL}$ to output a clock signal CLK. A frequency-time graph of the clock signal CLK may take a waveform of a control voltage $V_{CTRL}$ versus time graph.

Although not illustrated in the drawing, in an exemplary embodiment, the phase locked loop (PLL) 1210 further includes a divider (not illustrated) provided between an output terminal of the voltage controlled oscillator (VCO) 1215 and the sampling circuit (SC) 1211. The divider may receive a clock signal CLK from the voltage controlled oscillator (VCO) 1215 to divide the received clock CLK by a division rate (N). That is, to accurately control a data stream (DATA stream), the divider may divide the clock signal CLK by N (N is an integer which is 1 or greater than 1) to adjust a frequency of the clock signal CLK and provide the divided clock signal CLK to the sampling circuit (SC) 1211. However, for brevity of description, it is assumed that a division rate is 1, and thereby the divider is omitted.

Figure 4:
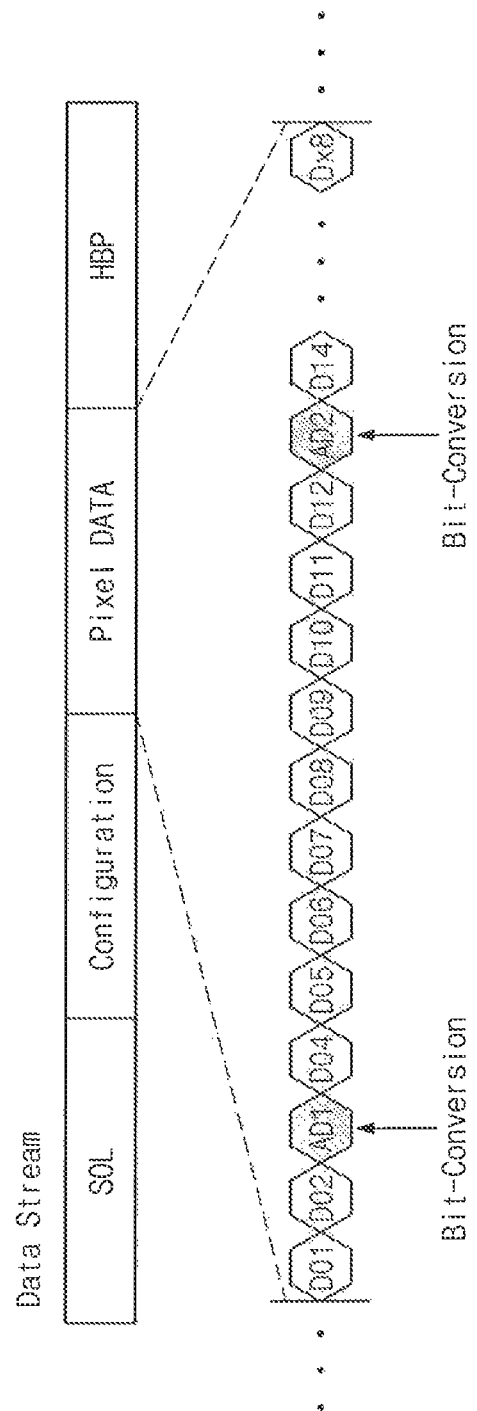
FIGS. 4 and 5 are drawings illustrating a format of a data stream of FIG. 3.
Figure 5:
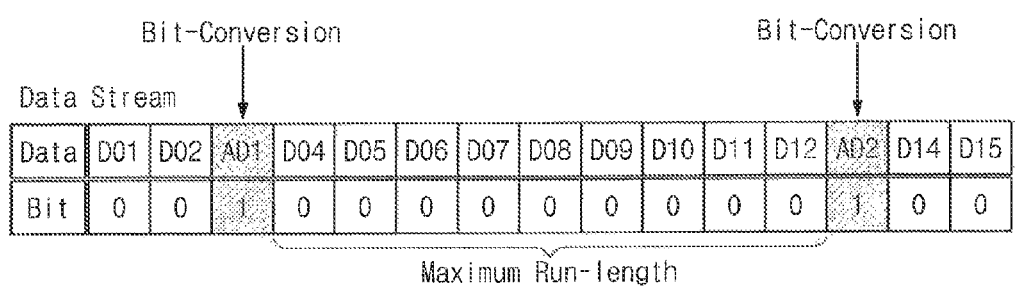

FIGS. 4 and 5 are drawings illustrating a format of a data stream of FIG. 3. The data stream may include start of line (SOL) information, configuration information, pixel data (pixel DATA), and a horizontal blanking time (HBP). The SOL information may be a signal notifying that among gray scale voltages being output to the display panel 140 (refer to FIG. 1), pixel data corresponding to a gray scale voltage being output to pixels connected to one gate line are transmitted. In an embodiment, the SOL information indicates a specific pixel row or gate of the display panel for outputting the pixel data. The configuration information may include register values for setting the source driver 130 (refer to FIG. 1). The pixel data (pixel DATA) may include substantive image information for generating gray scale voltages to be output to the display panel 140. The horizontal blanking time (HBP) may refer to a waiting time for outputting pixel data (pixel DATA) to a next frame. For example, during the horizontal blanking time (HBP), pixel data is not output to the display panel 140.

Pixel data (pixel DATA) being transmitted from the timing controller 110 to the source driver 130, as illustrated in the drawing, may be serialized data. In an embodiment, one additional bit (AD1, AD2, AD3, etc.) is added to the data stream (DATA stream) every reference period. For example, the resulting data may include a plurality of groups of pixel data of a same bit length where the additional bit is located between each of the groups. The additional bit may be a dummy bit added to detect errors that occur during a transmission of the data stream (DATA stream) from the timing controller 110 to the source driver 130, or during a processing of the data stream (DATA stream) in the source driver 130. In the drawing, it is illustrated that one additional bit is added to the pixel data (pixel DATA) at every 9 bits. However, in alternate embodiments, the additional bit is added to the SOL information, the configuration information or the HBP. Further, in alternate embodiments, the one additional bit is added at every other number of bits.

An insertion example of the additional bit (AD1, AD2, AD3, etc.) that is bit-converted is illustrated in FIG. 5. Referring to FIG. 5, it is illustrated that an additional bit AD1 is added between data D02 and data D04, and an additional bit AD2 is added between D12 and D14. As described above, the additional bit AD1 has a value of logic '1' different from a value of the previous data D02. Similarly, the additional bit AD2 has a value of logic '1' different from a value of the previous data D12. The additional bit may be added by a source (e.g., timing controller) located outside the source driver 130.

Inserting an additional bit between the data stream (DATA stream) may limit the maximum run length. For example, to prevent consecutive data of the same bit from being received by the source driver 130, a bit-converted additional bit may be inserted into the middle of the data stream (DATA stream). Referring to FIG. 5, the data stream (DATA stream) is illustrated to have consecutive bits '0' and an additional bit '1' is inserted between the data D02 and the data D04 and between the data D12 and the data D14 to limit the maximum run length to 9. As will be described in detail later, additional bits inserted into the middle of the data stream (DATA stream) may be used to determine whether an output of the phase locked loop (PLL) 1210 (refer to FIG. 2) is locked.

Figure 6:
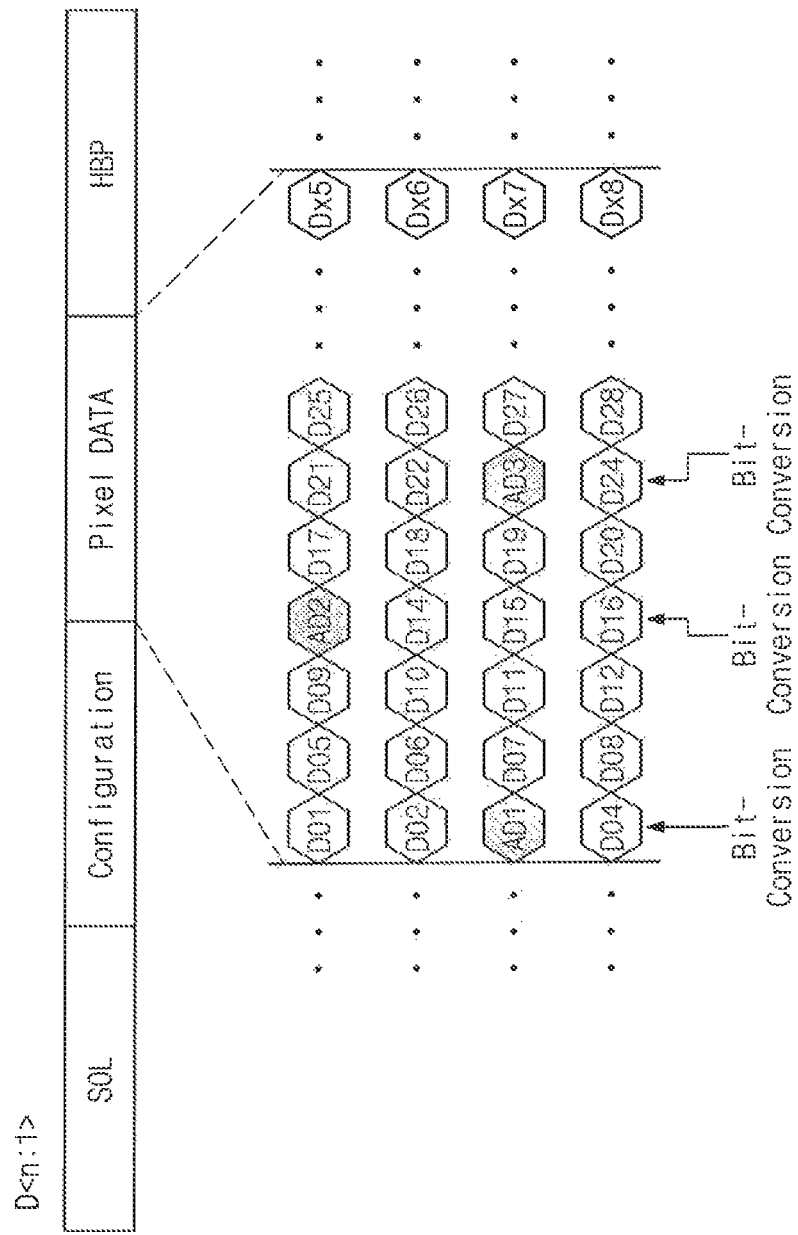
FIG. 6 is a drawing illustrating a format of data (D<n:1>) of FIG. 3.

FIG. 6 is a drawing illustrating a format of data (D<n:1>) of FIG. 3.

Referring to FIG. 6 together with FIG. 3, the sampling circuit (SC) may parallelize the serialized data stream (DATA stream) to output the data (D<n:1>). In the drawing, it is illustrated that data of 4 bits is output at the same time (i.e., n=1).

Although the serialized data stream (DATA stream) is parallelized and thereby the data (D<n:1>) is output from a phase locked loop (PLL) 1210, a bit-converted additional bit may be maintained as it is. In contrast, if the additional bits (AD1, AD2, AD3, etc.) included in the data (D<n:1>) do not have a bit-converted value, it may mean that an error occurred during a treatment process in the PLL 1210 (more specifically, an output of the PLL 1210 is not properly locked). Since a bit-converted additional bit is added according to a determined protocol, the source driver 1200 (refer to FIG. 2) may monitor the additional bits (AD1, AD2, AD3, etc.) included in the data (D<n:1>) in real time to detect whether the data (D<n:1>) is properly locked. An element for executing the detecting operation is illustrated in FIG. 7.

Figure 7:
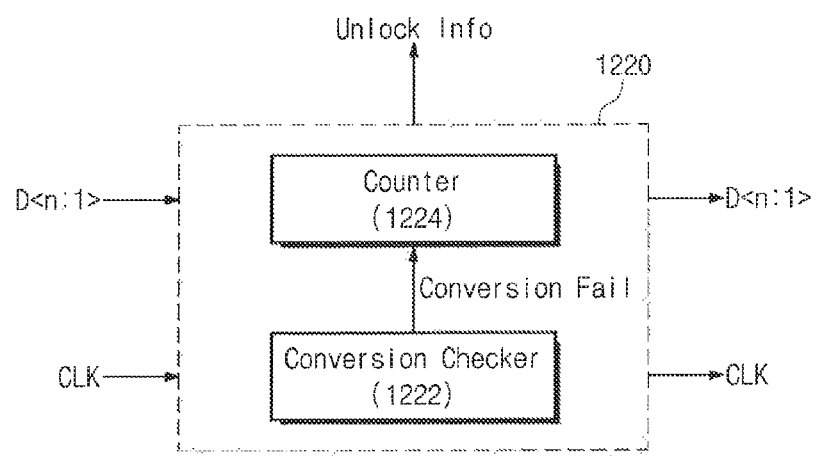
FIG. 7 is a block diagram illustrating a first detector of FIG. 2 according to an exemplary embodiment of the inventive concept.

FIG. 7 is a block diagram illustrating an exemplary embodiment of a first detector of FIG. 2. The first detector 1220 includes a conversion checker 1222 and a counter 1224. The first detector 1220 receives a parallelized data (D<n:1>) and a clock signal CLK from the PLL 1210 (refer to FIG. 2). The conversion checker 1222 checks whether additional bits included in the data (D<n:1>) have proper converted bit values. As described above, since the additional bit obeys a predetermined protocol, the conversion checker 1222 refers to information about a value of the additional bit and a position into which the additional bit is inserted. For example, the information may be directly received from the timing controller or may be stored in a separate register included inside the source driver 1200.

If the additional bit has a proper bit-converted value as a result of checking by the conversion checker 1222, this may mean the data (D<n:1>) is properly locked. Then the data (D<n:1>) and the clock signal CLK are transmitted to the driving circuit 1300 (refer to FIG. 2) as they are. If the additional bit does not have a proper bit-converted value as a result of checking by the conversion checker 1222, this may mean the data (D<n:1>) is not properly locked (i.e., unlocked). If the additional bit does not have the proper bit-converted value (e.g., a conversion fail), the counter 1224 counts the number of times a conversion fail has occurred. If the additional bit does not have the proper bit-converted value, the first detector 1220 transmits unlock information to an external destination (e.g., the timing controller 110 of FIG. 1). The timing controller 110 retransmits the data stream (DATA stream) to the source driver 130 when it receives information from the first detector 1220 indicating the data is not locked.

Even if the conversion fail occurs, the unlock information may not be transmitted to the timing controller 110 immediately. For example, if a counting value due to the conversion fail exceeds a predetermined value previously set, the unlock information is transmitted to the timing controller 130. For example, if the counting value does not exceed the predetermined value, the unlock information is not transmitted to the timing controller 130. However, then the unlock information is transmitted as soon as the counting value is incremented to a value that exceeds the predetermined value. At this time, the predetermined value may be set considering specifications of the timing controller 110, the gate driver 120, the source driver 130 and the display panel 140 that are part of the display device 100 (refer to FIG. 1) and system resources including the display device 100.

Figure 8:
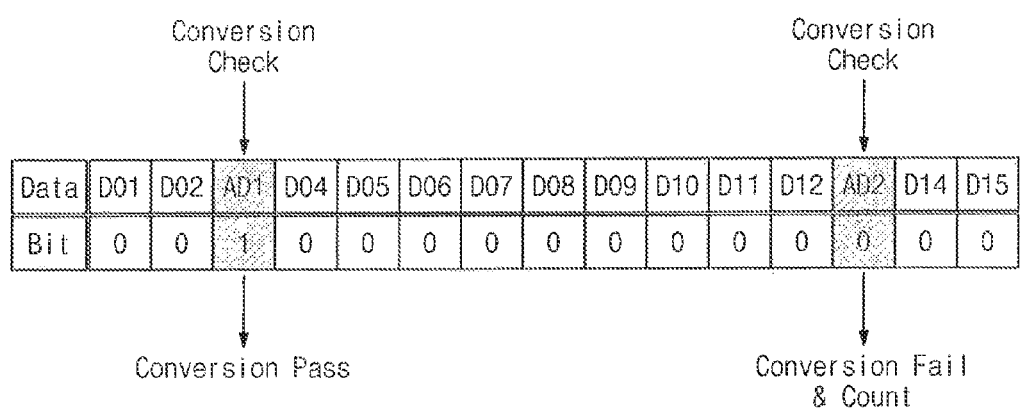
FIG. 8 is a drawing illustrating that a conversion success or a conversion fail is detected by the first detector of FIG. 7.

FIG. 8 is a drawing illustrating that a conversion success or a conversion fail is detected by a first detector of FIG. 7. As illustrated in FIG. 8, since 9-bit data (D04 through D12) exists between additional bits AD1 and AD2, it is assumed that the maximum run length is 9.

Since the data D02 of before the additional bit AD1 is inserted has a value of logic '0', the additional bit AD1 has '1' which is a bit-converted value. In this case, since a bit-conversion by an insertion of the additional bit is properly done, it is determined that the bit-conversion succeeded. Since the data D12 of before the additional bit AD2 is inserted has a value of logic '0', in principle, the additional bit AD2 should have '1' which is a bit-converted value. However, since a value of the additional bit AD2 is '0', this may indicate that the data stream (DATA stream) is not properly locked during a treatment process in the PLL 1210 (refer to FIG. 2). In this case, since a bit-conversion by an insertion of the additional bit is not properly done, it is determined that the bit-conversion failed.

As described above, a data recovery circuit 1200 includes the first detector 1220 to determine whether a bit-conversion by an additional bit is properly executed and thereby it may be detected whether an output of the PLL 1210 has properly locked the clock signal. The timing controller 110 retransmits the data stream (DATA stream) by transmitting a detection result to the timing controller and thereby performance of the display device may be improved.

Figure 9:
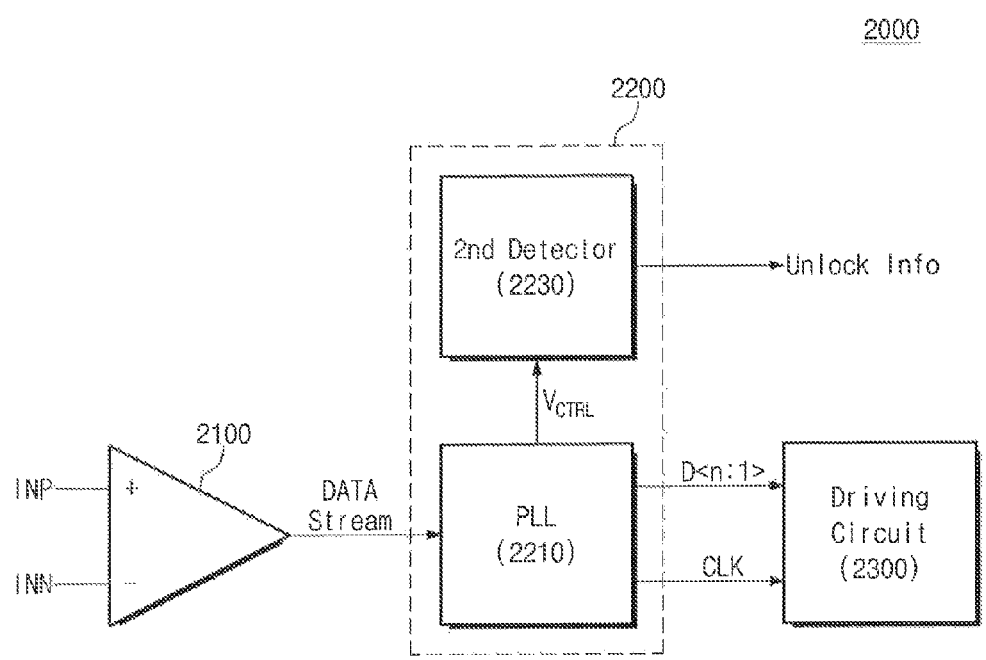
FIG. 9 is a block diagram illustrating a source driver of FIG. 1 according to an exemplary embodiment of the inventive concept.

FIG. 9 is a block diagram illustrating a source driver of FIG. 1 according to an exemplary embodiment of the inventive concept. Referring to FIG. 9, a source driver 2000 includes an amplifier 2100, a clock and data recovery circuit 2200, and a driving circuit 2300. The clock and data recovery circuit 2200 includes a phase locked loop (PLL) 2210 and a second detector 2230. Since a structure and an operation of the amplifier 2100, the clock and data recovery circuit 2200, and the driving circuit 2300 are the same as those described in FIG. 2, overlapping descriptions thereof are omitted.

A graph of a control voltage $V_{CTRL}$ output from the loop filter 1214 (refer to FIG. 3) of the PLL 2210 versus time has the same waveform as the graph of a frequency of a clock CLK signal output from the voltage controlled oscillator (VCO) 1215 versus time. That is, the graph of the control voltage $V_{CTRL}$ versus time may have a constant value or may have a regular pattern (for instance, a triangle wave, a sine wave, hershey-kiss profile, etc.). That is, if a level of the control voltage $V_{CTRL}$ goes beyond a certain range or does not have a specific pattern, this may indicate that an output of the PLL 2210 is not properly locked. In an embodiment, the clock and data recovery circuit 2200 uses a characteristic of the control voltage $V_{CTRL}$.

Figure 10:
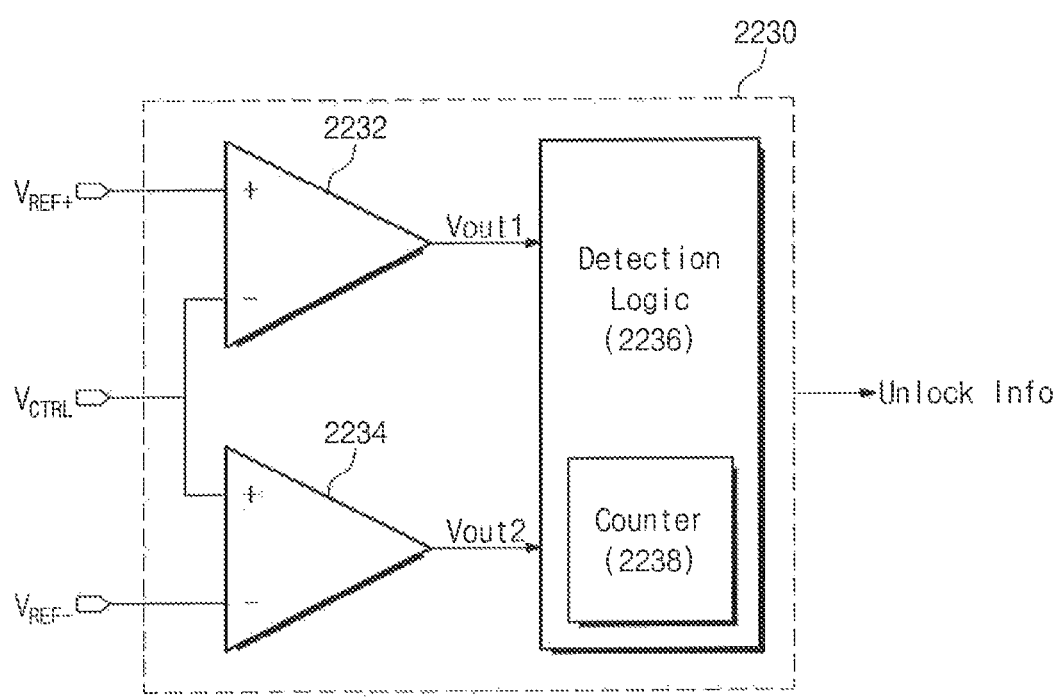
FIG. 10 is a block diagram illustrating a second detector of FIG. 9 according to an exemplary embodiment of the inventive concept.

FIG. 10 is a block diagram illustrating a second detector of FIG. 9 according to an exemplary embodiment of the inventive concept. Referring to FIG. 10, the second detector 2230 includes a first amplifier 2232, a second amplifier 2234, and detection logic 2236. For example, the first amplifier 2232 may receive a control voltage $V_{CTRL}$ and a first reference voltage $V_{REF+}$ greater than the control voltage $V_{CTRL}$ to output a first voltage Vout1. The second amplifier 2234 may receive the control voltage $V_{CTRL}$ and a second reference voltage $V_{REF-}$ less than the control voltage $V_{CTRL}$ to output a second voltage Vout2.

The detection logic 2236 may determine whether an output (i.e., D<n:1>) of the PLL 2210 (refer to FIG. 9) is properly locked based on the first voltage Vout1 and the second voltage Vout2. If the data (D<n:1>) output from the PLL 2210 (refer to FIG. 9) is not properly locked, this may be sequentially reflected in values of the control voltage $V_{CTRL}$, the first voltage Vout1 and the second voltage Vout2. The detection logic 2236 may determine whether the data (D<n:1>) is properly locked based on the predetermined value or pattern of the first and second voltages Vout1 and Vout2. If the data (D<n:1>) is not properly locked, the second detector 2230 transmits unlock information to the timing controller 110 (refer to FIG. 2).

The second detector 2230 includes a counter 2238 similar to the embodiment described in FIG. 7. That is, even if it is determined that the data (D<n:1>) output from the PLL 2210 is not properly locked, the second detector 2230 does not immediately transmit the unlock information to the timing controller 110. That is, if it is determined that the data (D<n:1>) output from the PLL 2210 is unlocked and thereby a counted value exceeds a predetermined value, the second detector 2230 transmits the unlock information to the timing controller 110. At this time, the predetermined value may be set considering specifications of the timing controller 110, the gate driver 120, the source driver 130 and the display panel 140 that are part of the display device 100 (refer to FIG. 1) and system resources including the display device 100.

Like the embodiment described above, it may be detected whether an output of the PLL 2210 is properly locked by monitoring a value of the control voltage VCTRL generated from the PLL 2210. Performance of the display device may be improved by transmitting a detection result to the timing controller and making the timing controller retransmit a data stream (DATA stream).

Figure 11:
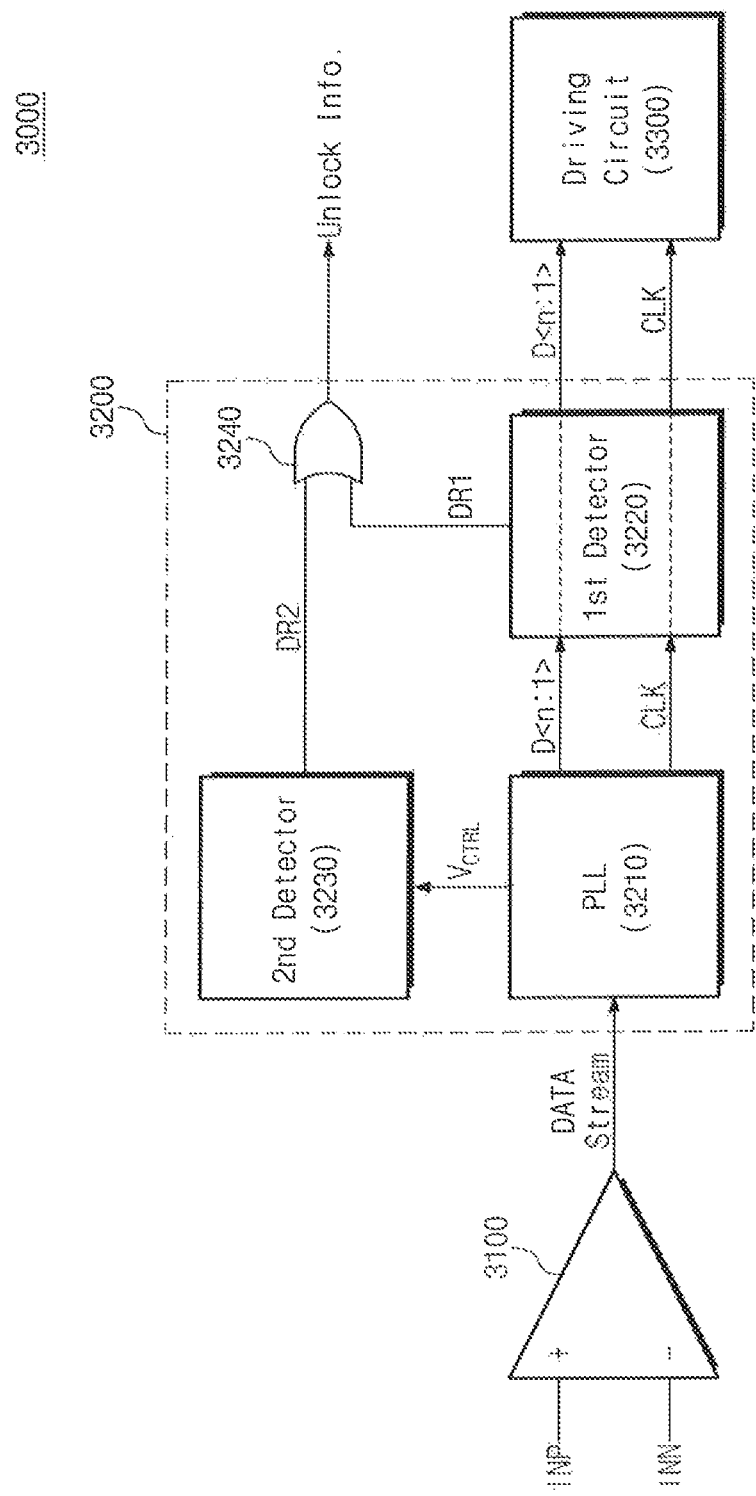
FIG. 11 is a block diagram illustrating a source driver of FIG. 1 according to an exemplary embodiment of the inventive concept.

FIG. 11 is a block diagram illustrating a source driver of FIG. 1 according to an exemplary embodiment of the inventive concept. Referring to FIG. 11, the source driver 3000 includes an amplifier 3100, a clock and data recovery circuit 3200, and a driving circuit 3300. The clock and data recovery circuit 3200 includes a phase locked loop (PLL) 3210, a first detector 3220, a second detector 3230, and an OR gate 3240. Since a structure and an operation of the amplifier 3100, the PLL (phase locked loop) 3210, the first detector 3220, the second detector 3230 and the driving circuit 330 are the same as those of the embodiments described above, overlapping descriptions thereof are omitted.

In the present embodiment, an OR gate 3240 for performing an OR operation with respect to a first detection result DR1 by the first detector 3220 and a second detection result DR2 by the second detector 3230 is further included. That is, if by any one of the first detector 3220 and the second detector 3230, it is determined that an output (D<n:1>) of the PLL 3210 is not properly locked, an unlock information is transmitted to the timing controller 110 (refer to FIG. 1).

Even if it is determined that the output (D<n:1>) of the PLL 3210 is not properly locked, the unlock information may not always be transmitted to the timing controller 110. As described in the aforementioned embodiments, the first detector 3220 and the second detector 3230 may include a counter respectively and if a counting value exceeds a predetermined value, the unlock information is transmitted to the timing controller 110. In an exemplary embodiment, the first detector 3220 and the second detector 3230 don't include the counter respectively but a counter may instead be provided at an output terminal of the OR gate 3240 or an input terminal of the OR gate 3240.

As described above, by including the first detector 3220 and the second detector 3230 in the clock and data recovery circuit 3200, it may be detected whether an output of the PLL 3210 is properly locked. Performance of the display device may be improved by transmitting a detection result to the timing controller and making the timing controller retransmit a data stream (DATA stream).

Figure 12:
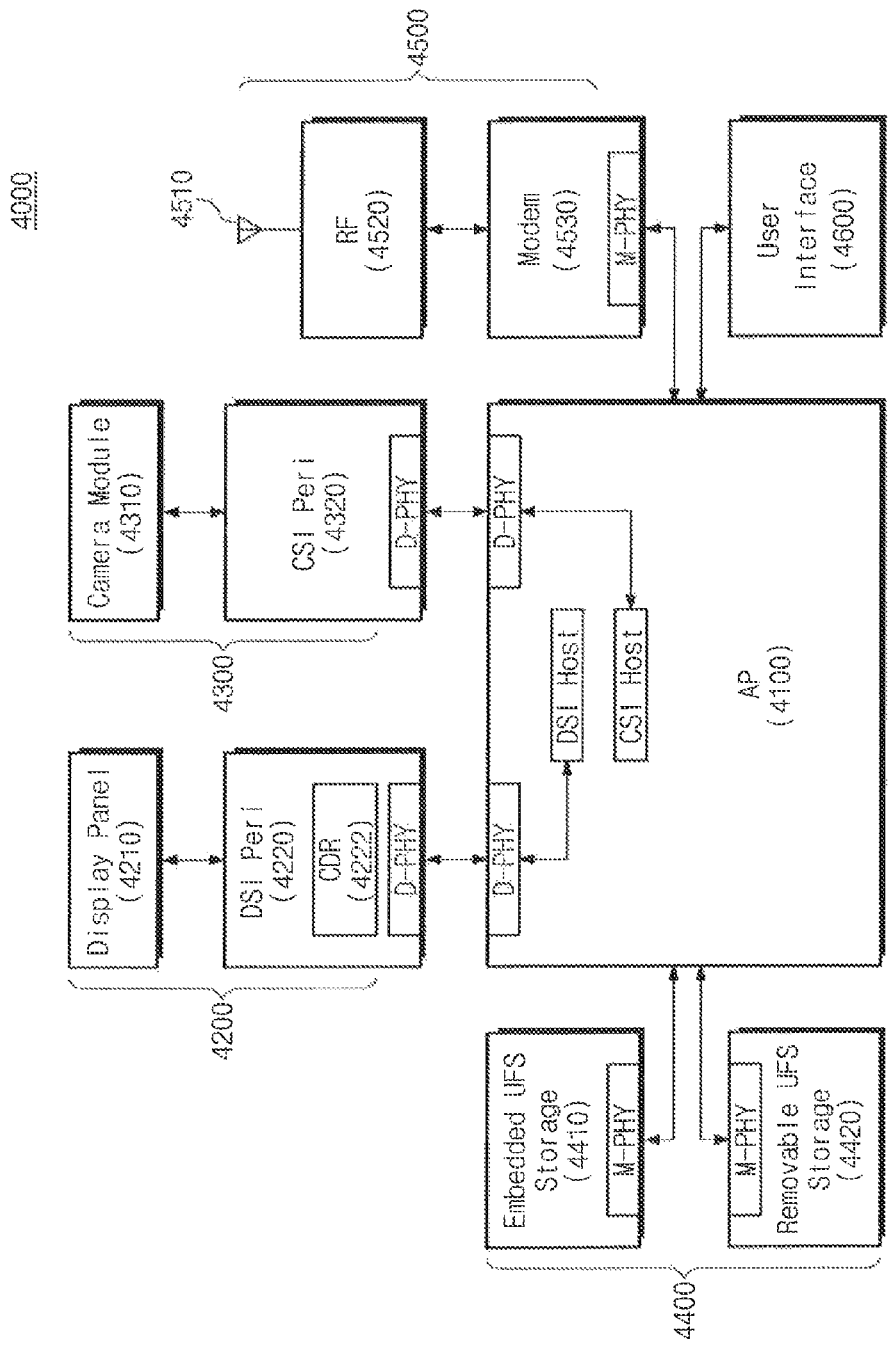
FIG. 12 is a block diagram illustrating a mobile device to which the inventive concept may be applied.

FIG. 12 is a block diagram illustrating a mobile device to which the inventive concept may be applied. Referring to FIG. 12, a mobile device 4000 may be configured to support a mobile industry processor interface (MIPI) standard or an embedded display port (EDP) standard. The mobile device 4000 includes an application processor 4100, a display unit 4200, an image processing unit 4300, data storage 4400, a wireless transmit/receive unit 4500, and a user interface 4600.

The application processor 4100 may control an overall operation of the mobile device 4000. The application processor 4100 may include a display serial interface (DSI) host performing an interfacing with the display unit 4200 and a camera serial interface (CSI) host performing an interfacing with the image processing unit 4300.

The display unit 4200 includes a display panel 4210 and a DSI peripheral circuit 4220. The display panel 4210 may display image data. The DSI host built in the application processor 4100 may perform a serial communication with the display panel 4210 through DSI. The DSI peripheral circuit 4220 may include a timing controller, a source driver, etc. needed to drive the display panel 4210.

The source driver may include a clock and data recovery circuit 4222. The clock and data recovery circuit 4222, as described above, may process a data stream received from the DSI host to transmit parallelized data to the display panel 4210. The clock and data recovery circuit 4222 may determine whether the parallelized data is properly locked. If it is determined that the parallelized data is not properly locked, the clock and data recovery circuit 4222 transmits a determination result to the DSI host. The DSI host retransmits a data stream to the DSI peripheral circuit 4222 in response to the result.

The image processor 4300 includes a camera module 4310 and a camera serial interface (CSI) peripheral circuit 4320. The camera module 4310 and the CSI peripheral circuit 4320 may include a lens, an image sensor, an image processor, etc. Image data generated in the camera module 4310 may be processed in the image processor and the processed image data may be transmitted to the application processor 4100 through CSI.

The data storage 4400 may include an embedded universal flash storage (UFS) storage 4410 and a removal UFS card 4420. The embedded UFS storage 4410 and the removal UFS card 4420 may perform a communication with the application processor 4100 through a M-PHY layer. A host (e.g., application processor 4100) may include a bridge to communicate with the removal UFS card 4420 by a protocol different from a UFS protocol. The application processor 4100 may communicate with the removal UFS card 4420 by various types of protocols such as uplink failure detection (UFD), MultiMediaCard (MMC), embedded MultiMediaCard (eMMC), secure digital (SD), mini SD, Micro SD, etc. The embedded UFS storage 4410 may be implemented by a three-dimensional (3D) nonvolatile memory device in which a cell string having memory cells is formed in a direction perpendicular to a substrate.

The wireless transmit/receive unit 4500 includes an antenna 4510, a radio frequency (RF) unit 4520, and a modem 4530. The modem 4530 is illustrated to communicate with the application processor 4100 through the M-PHY layer. However, in an exemplary embodiment, the modem 4530 is embedded in the application processor 4100.

According to some embodiments of the inventive concept, a clock and data recovery circuit may detect whether an output of a phase locked loop (PLL) is properly locked and may transmit a detection result to a timing controller.

While some exemplary embodiments of the inventive concept have been particularly shown and described, it will be understood by one of ordinary skill in the art that variations in form and detail may be made therein without departing from the spirit and scope of the inventive concept.

What is claimed is:

1. A clock and data recovery circuit comprising:
   a phase locked loop configured to receive a data stream into which an additional bit is inserted at every reference period to generate parallelized data and a clock signal; and
   a first detector circuit configured to determine whether the parallelized data is locked based on a bit-conversion of the data stream according to an insertion of the additional bits,
   wherein the bit-conversion is executed with respect to the additional bits according to a predetermined protocol, or is executed with respect to at least one bit from among data of the data stream located between a current one of the additional bits and a next one of the additional bits.

2. The clock and data recovery circuit of claim 1, wherein as a result of the bit-conversion, one of the additional bits and data just ahead of the one additional bit have different logic values from each other.

3. The clock and data recovery circuit of claim 1, wherein the first detector circuit comprises a first counter configured to count a number of times the bit-conversion fails.

4. The clock and data recovery circuit of claim 3, wherein the first detector circuit determines that the parallelized data is unlocked when the counted number of times exceeds a reference number and transmits a value to an outside source indicating whether the parallelized data is unlocked.

5. The clock and data recovery circuit of claim 1, wherein the phase locked loop comprises:
   a sampling circuit configured to synchronize the data stream with the clock signal, and to parallelize the synchronized data stream to generate the parallelized data;
   a phase detector configured to detect a phase difference between the synchronized data stream and the clock signal to output an up signal and a down signal;
   a charge pump configured to receive the up signal and the down signal to output a control current;
   a loop filter configured to receive the control current to output a control voltage; and
   a voltage controlled oscillator configured to receive the control voltage to generate the clock signal.

6. The clock and data recovery circuit of claim 5, further comprising a second detector circuit configured to receive the control voltage and to determine whether the parallelized data is locked on the basis of a first reference voltage greater than a level of the control voltage and a second reference voltage smaller than the level of the control voltage.

7. The clock and data recovery circuit of claim 6, wherein the second detector circuit comprises:
   a first amplifier configured to receive the first reference voltage and the control voltage to output a first voltage;
   a second amplifier configured to receive the second reference voltage and the control voltage to output a second voltage; and
   a logic circuit configured to determine whether a level of the control voltage is between a level of the first reference voltage and a level of the second reference voltage on the basis of the first voltage and the second voltage.

8. The clock and data recovery circuit of claim 7, wherein the logic circuit comprises a second counter configured to count a number of times the bit-conversion has failed on the basis of an output of the logic circuit.

9. The clock and data recovery circuit of claim 8, wherein the second detector circuit determines that the parallelized data is unlocked when the counted number of times exceeds a reference number and transmits a value to an outside source indicating whether the parallelized data is unlocked.

10. A clock and data recovery circuit comprising:
    a phase locked loop configured to receive a data stream into which an additional bit is inserted at every reference period to generate parallelized data and a clock signal;
    a first detector circuit configured to determine whether the parallelized data is locked based on a bit-conversion of the data stream according to an insertion of the additional bits; and
    a second detector circuit configured to determine whether the parallelized data is locked based on a control voltage output from the phase locked loop,
    wherein the bit-conversion is executed with respect to the additional bits according to a predetermined protocol, or is executed with respect to at least one bit from among data of the data stream located between a current one of the additional bits and a next one of the additional bits.

11. The clock and data recovery circuit of claim 10, further comprising an OR gate configured to perform an OR operation on an output of the first detector circuit and an output of the second detector circuit.

12. The clock and data recovery circuit of claim 10, wherein the phase locked loop comprises:
    a sampling circuit configured to synchronize the data stream with the clock signal and to parallelize the synchronized data stream to generate the parallelized data;
    a phase detector configured to detect a phase difference between the synchronized data stream and the clock signal to output an up signal and a down signal;
    a charge pump configured to receive the up signal and the down signal to output a control current;
    a loop filter configured to receive the control current to output a control voltage; and
    a voltage controlled oscillator configured to receive the control voltage to generate the clock signal.

13. The clock and data recovery circuit of claim 10, wherein the first detector circuit comprises a first counter configured to count a number of times the bit-conversion fails, and
    wherein the first detector circuit determines that the parallelized data is unlocked when the counted number of times exceeds a reference number and transmits a value to an outside source indicating whether the parallelized data is unlocked.

14. The clock and data recovery circuit of claim 10, wherein the second detector circuit comprises:
    a first amplifier configured to receive the first reference voltage and the control voltage to output a first voltage;
    a second amplifier configured to receive the second reference voltage and the control voltage to output a second voltage; and
    a logic circuit configured to determine whether a level of the control voltage is between a level of the first reference voltage and a level of the second reference voltage on the basis of the first voltage and the second voltage.

15. The clock and data recovery circuit of claim 14, wherein the logic circuit comprises a second counter configured to count a number of times the bit-conversion fails on the basis of an output of the logic circuit, and
    wherein the second detector circuit determines that the parallelized data is unlocked when the counted number exceeds the reference number and transmits a value to an outside source indicating whether the parallelized data is unlocked.

16. A display apparatus driving circuit comprising:
    a timing controller configured to insert an additional bit periodically into received image data to generate modified image data, generate a data stream including the modified image data, and output the data stream; and
    a source driver configured to receive the data stream, the source driver comprising:
       a phase locked loop configured to generate parallelized data and a clock signal from the received data stream; and
       a detector circuit configured to determine whether the parallelized data is locked based on values of the additional bits in the received data stream.

17. The display apparatus driving circuit of claim 16, wherein the timing controller inserts the additional bit with a value different from an adjacent bit.

18. The display apparatus driving circuit of claim 16, wherein the detector circuit outputs a value to the timing controller indicating whether the parallelized data is locked.

19. The display apparatus driving circuit of claim 18, wherein the timing controller retransmits the data stream to the source driver when the value indicates the parallelized data is not locked.

20. The display apparatus driving circuit of claim 16, wherein the phase locked loop comprises:
- a sampling circuit configured to synchronize the data stream with the clock signal, and to parallelize the synchronized data stream to generate the parallelized data;
- a phase detector configured to detect a phase difference between the synchronized data stream and the clock signal to output an up signal and a down signal;
- a charge pump configured to receive the up signal and the down signal to output a control current;
- a loop filter configured to receive the control current to output a control voltage; and
- a voltage controlled oscillator configured to receive the control voltage to generate the clock signal.

* * * * *